United States Patent
Hidaka

(10) Patent No.: US 7,400,509 B2
(45) Date of Patent: Jul. 15, 2008

(54) ELECTRONIC APPARATUS, RACK MOUNT APPARATUS AND METHOD OF MOUNTING THE ELECTRONIC APPARATUS IN THE RACK MOUNT APPARATUS

(75) Inventor: Hiroshi Hidaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 308 days.

(21) Appl. No.: 11/222,278

(22) Filed: Sep. 8, 2005

(65) Prior Publication Data
US 2006/0290245 A1 Dec. 28, 2006

(30) Foreign Application Priority Data
Jun. 24, 2005 (JP) ............... 2005-184760

(51) Int. Cl.
*H05K 7/18* (2006.01)
(52) U.S. Cl. ............... 361/727; 360/69; 720/690; 211/26
(58) Field of Classification Search ............... 211/26; 720/616, 658, 690; 369/30, 36, 30.36; 360/69; 361/679–687, 724–727
See application file for complete search history.

(56) References Cited

U.S. PATENT DOCUMENTS

| | | | |
|---|---|---|---|
| 6,424,534 B1 | 7/2002 | Mayer et al. | 361/724 |
| 6,464,085 B1 * | 10/2002 | Chin et al. | 211/26 |
| 6,788,542 B2 * | 9/2004 | Rumney | 361/724 |
| 2004/0182798 A1 * | 9/2004 | Williams | 211/26 |
| 2004/0240166 A1 * | 12/2004 | Kuo | 361/683 |
| 2006/0028805 A1 * | 2/2006 | Hidaka | 361/754 |

FOREIGN PATENT DOCUMENTS

| | | |
|---|---|---|
| JP | 11-330743 | 11/1999 |
| JP | 2000-323873 | 11/2000 |
| JP | 2004-054967 | 2/2004 |

* cited by examiner

*Primary Examiner*—Hung V Duong
(74) *Attorney, Agent, or Firm*—Greer, Burns & Crain, Ltd.

(57) ABSTRACT

An electronic apparatus that can be ejectably mounted in a rack mount apparatus that includes a first housing and a mechanism adapted to project from the first housing includes a second housing that is fixed onto the mechanism, and mounted in the first housing so that the second housing can be drawn from the first housing; and a provisional fixture member that is attached to the second housing and engageable with the mechanism.

15 Claims, 14 Drawing Sheets

← SCREWING FROM BOTH SIDES

↑ SUPPORTING USING LIFTER OR A FEW PEOPLE

ELECTRONIC APPARATUS, RACK MOUNT APPARATUS AND METHOD OF MOUNTING THE ELECTRONIC APPARATUS IN THE RACK MOUNT APPARATUS

This application claims foreign priority based on Japanese Patent Application No. 2005-184760 filed on Jun. 24, 2005, which is hereby incorporated by reference herein in its entirety as if fully set forth herein.

BACKGROUND OF THE INVENTION

The present invention relates generally to a rack mount apparatus that accommodates plural electronic apparatuses so that each electronic apparatus can be drawn from and inserted into a housing of the rack mount apparatus, and more particularly to a mounting mechanism and method for mounting an electronic apparatus in the rack mount apparatus. The present invention is suitable, for example, for a mounting mechanism used to mount in a rack mount apparatus a disc array storage that installs plural hard disc drive ("HDD") units.

A disc array storage that removably installs plural HDD units has recently been proposed so as to realize a large-capacity external storage (see, for example, Japanese Patent Application, Publication No. 2004-54967). The disc array storage allows only a target HDD unit that requires maintenance, to be exchanged while keeping a running state of the entire apparatus, and also includes a fixing mechanism that prevents unintentional ejections of the HDD unit(s) from the disc array storage due to vibrations, etc. A rack mount apparatus that is mounted with plural disc array storages in a rack mount manner is also known (see, for example, Fujitsu Japan, Product Lineup, ETERNUS, http://storage-system.fujitsu.com/jp/products/, searched on Jun. 21, 2005). Such a rack mount apparatus requires the improved operability in mounting the disc array storage in and detaching the disc array storage from the rack mount storage.

Other prior art include Japanese Patent Application, Publication No. 11-330743.

The conventional disc array storage is screwed onto a rack mount apparatus, and each HDD unit is inserted into the disc array storage ejectably through a front surface of the disc array storage. However, in order to meet with the recent demand for the large capacity by increasing the installation density of the HDD units, the instant inventor has studied a structure that makes the disc array storage drawable from the rack mount apparatus, and opens the top surface of the disc array storage so that plural HDD units in a matrix can be inserted into and ejected from the disc array storage along the height direction of the disc arrays storage. In this case, if the rack mount apparatus has a mechanism that projects from and retreats into the housing of the rack mount apparatus, and the disc array storage is fixed (e.g., screwed) onto the mechanism, the disc array storage can be drawn from the rack mount apparatus. One known mechanism applicable to this purpose is a slide rail disclosed in Takachiho Koheki Co., Ltd., Products and Service, Mechanical Component Product, Slide Rail 5800 Series, http://www.takachiho-kk.co.jp/products/mechanical/slide/5800.html, searched on Jun. 21, 2005.

In order to fix the disc array storage onto the above slide rails and mount the disc array storage in the rack mount apparatus, it is necessary to hold the disc array storage relative to a pair of slide rails so that the pair of slide rails are arranged in place relative to both side surfaces of the disc array storage, and then to screw the slide rails onto the disc array storage. However, it is difficult to screw the slide rails onto the disc array storage while holding the disc array storage in place relative to the slide rails. This difficulty increases, as the disc array storage is heavier than 60 kg due to the high installation density of the HDD units.

BRIEF SUMMARY OF THE INVENTION

Accordingly, it is an exemplary object to provide an electronic apparatus, a rack mount apparatus and a mounting method, in which the electronic apparatus can be easily mounted on the rack mount apparatus.

An electronic apparatus according to one aspect of the present invention that can be ejectably mounted in a rack mount apparatus that includes a first housing and a mechanism adapted to project from the first housing includes a second housing that is fixed onto the mechanism, and mounted in the first housing so that the second housing can be drawn from the first housing, and a provisional fixture member that is attached to the second housing and engageable with the mechanism. According to the electronic apparatus, such as a disc array storage, the provisional fixture member holds the second housing relative to the first housing, and eliminates the necessity to support the second housing in finally fixing the second housing onto the mechanism, such as a slide rail, facilitating the operation. The provisional fixture member includes, for example, a flat spring provided near a front surface of the second housing, the flat spring being able to retreat into the second housing and project from the second housing.

The electronic apparatus may further include a moving unit that enables the second housing to move relative to the first housing. The provisional fixture is automatically realized by moving the second housing relative to the first housing utilizing the moving unit, improving the workability. The moving unit includes, for example, a guide frame attached to the second housing and slidable on the mechanism.

The guide frames may be attached to a pair of side surfaces that is orthogonal to a front surface of the second housing, and may have such a U-shaped section that the guide frame includes a horizontal part parallel to the side surface of the second housing, and a pair of perpendicular parts perpendicular to the side surface. This structured guide frame can be commonly used for both side surfaces of the second housing. Since it is unnecessary to produce different structured guide frames for left and right side surfaces, the manufacturing efficiency improves. Preferably, the pair of perpendicular parts have a pair of proximal ends, and a pair of distal ends, the pair of proximal ends being closer to the front surface of the second housing than the pair of distal ends, the pair of distal ends being bent in such a direction that the distal ends approach to each other. This structure reduces the interference between the guide frame and the mechanism, and improves the workability in detaching the electronic apparatus from the rack mount apparatus.

Preferably, the moving unit is adapted to displace between first and second positions, wherein when the moving unit is located at the first position, the second housing moves relative to the first housing while the moving unit contacts the rack mount apparatus, and wherein when the moving unit is located at the second position, the second housing moves relative to the first housing while the moving unit is being spaced from the rack mount apparatus. According to this structure, the moving unit is set to the first position and used in mounting the second housing in the first housing, whereas the moving unit is set to the second position so that the second housing is moved through the mechanism after the second housing is mounted in the first housing. This structure also prevents interference between the moving unit and the mechanism after the mounting is completed.

The moving unit may have first and second ends, wherein the moving unit is attached to the second housing rotatably at the first end, and the moving unit is engageable with two different positions of the second housing at the second end, the moving unit including a thumbscrew at the second end. The thumbscrew does not require a tool, such as a screwdriver, and improves the workability.

Preferably, the guide frame has a length of at least L/2 and covers a range from L/4 to 3L/4 from the front surface of the second housing, where L is a length of the second housing in a drawing direction. When the guide frame is too long, it is difficult to retreat the guide frame from the mechanism after mounting. When the guide frame is too short, the mounting work becomes difficult. Therefore, this range is preferable.

Plural units may be attached to and ejected from the electronic apparatus along a height direction of the electronic apparatus. When the electronic apparatus has an open top surface and a unit, such as a HDD unit, is removably inserted along the height direction, the electronic apparatus can install the units with a high installation density.

A rack mount apparatus according to another aspect of the present invention that is mounted with an electronic apparatus so that the electronic apparatus can be drawn from the rack mount apparatus includes a first housing and a mechanism that is adapted to project from the first housing, wherein the electronic apparatus includes a second housing that is fixed onto the mechanism, and a provisional fixture member that is attached to the second housing and engageable with the mechanism. This rack mount apparatus exhibits an operation of the above electronic apparatus.

The electronic apparatus may further include a guide frame attached to the second housing and slidable on the mechanism, the guide frame enabling the second housing to move relative to the first housing, the mechanism having a first end, the guide frame having a second end, at least one of the first and second ends being inclined, wherein in inserting the second housing that has been drawn from the first housing, into the first housing, the second end of the guide frame contacts the first end of the mechanism. This structure reduces the interference between the guide frame and the mechanism, and improves the workability in detaching the electronic apparatus from the rack mount apparatus.

A method according to another aspect of the present invention for mounting an electronic apparatus in a rack mount apparatus having a first housing and a mechanism adapted to project from the first housing, an electronic apparatus including a second housing includes the steps of provisionally fixing the second housing onto the mechanism, and finally fixing the second housing onto the mechanism while the second housing being moved relative to the first housing. According to this method, the provisionally fixing step provides the provisional fixture that holds the second housing relative to the first housing, eliminates the necessity to hold the second housing in finally fixing the second housing onto the mechanism, such as a slide rail, and improves the workability.

The provisional fixing step may include the step of inserting the second housing into the first housing so as to effectuate provisional fixing, and the finally fixing step may include the step of drawing from the first housing the second housing with the mechanism that has been provisionally fixed onto the second housing. When the housing or moving action provides the provisional fixture, the workability improves. When the second housing is finally fixed while drawn from the first housing, the overload upon the provisional fixture member and possible dropping of the second housing from the first housing can be prevented.

The inserting step may include the step of setting to a first state a moving unit that enables the second housing to move relative to the first housing, wherein the method may further include the step of setting the moving unit to a second state different from the first state after the finally fixing step, wherein when the moving unit is located at the first position, the second housing moves relative to the first housing while the moving unit contacts the rack mount apparatus, and wherein when the moving unit is located at the second position, the second housing moves relative to the first housing while the moving unit is being spaced from the rack mount apparatus. According to this structure, the moving unit is set to the first position and used in mounting the second housing in the first housing, whereas the moving unit is set to the second position so that the second housing is moved through the mechanism after the second housing is mounted in the first housing. This structure also prevents interference between the moving unit and the mechanism after the mounting is completed.

Other objects and further features of the present invention will become readily apparent from the following description of the preferred embodiments with reference to accompanying drawings.

DETAILED DESCRIPTION OF THE PREFERRED EMBODIMENTS

Figure 1:
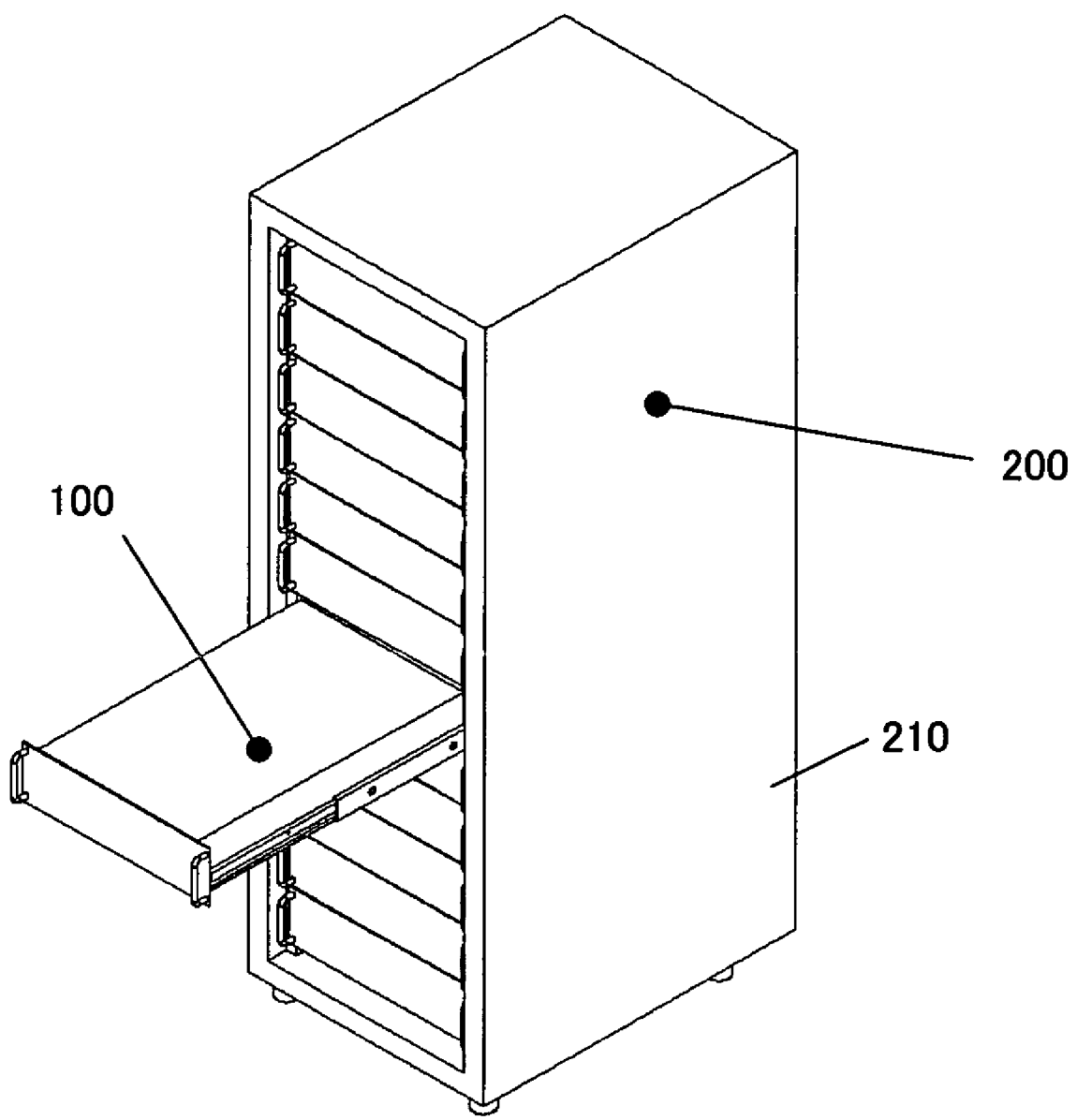
FIG. 1 is a schematic perspective view of a rack mount apparatus according to one aspect of the present invention.

Referring now to the accompanying drawings, a description will be given of a rack mount apparatus 200 and a disc array storage 100 to be mounted in the rack mount apparatus 200 according to one embodiment of the present invention. Here, FIG. 1 is a perspective overview of the rack mount apparatus 200. The rack mount apparatus 200 serves as a large-capacity storage, and is mounted with plural stages of disc array storages 100 so that each of them can be drawn from the rack mount apparatus 200. FIG. 1 omits a guide frame 160 of the disc array storage 100.

Figure 2A:
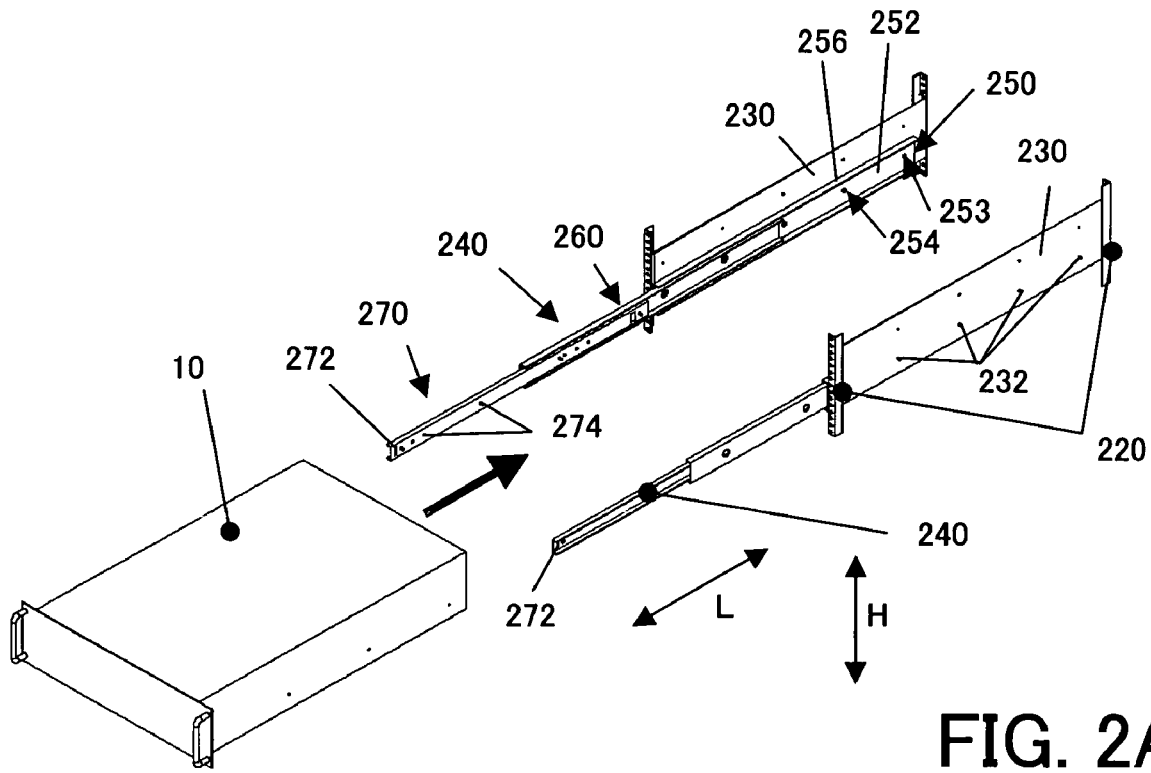
FIGS. 2A and 2B are perspective overviews showing final fixtures of the disc array storage onto the rack mount apparatus without provisional fixtures.
Figure 2B:
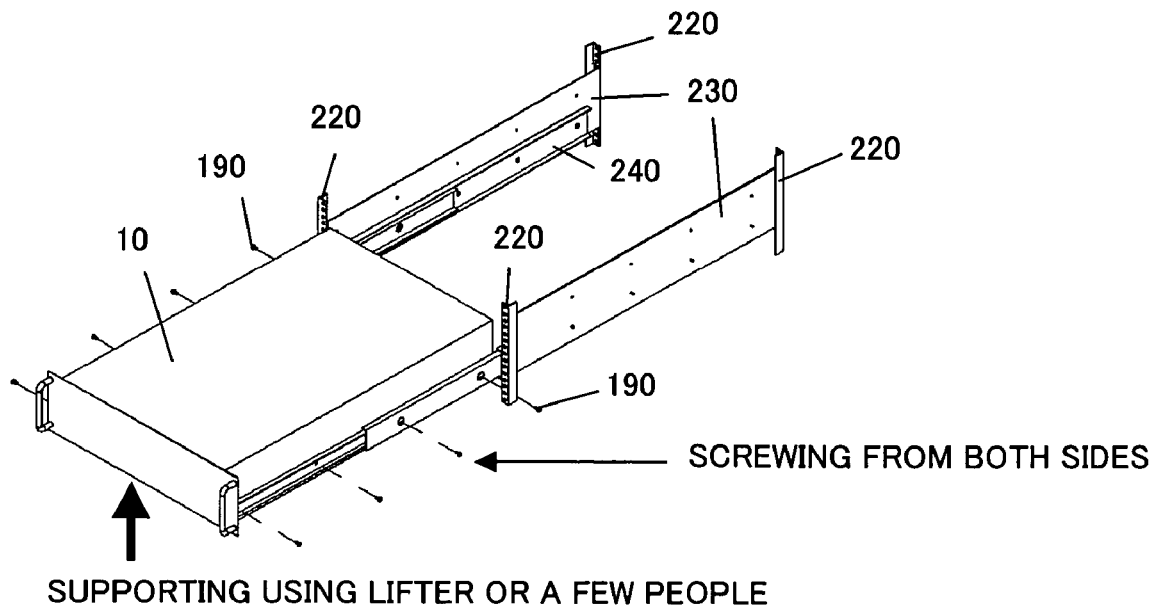
Figure 3:
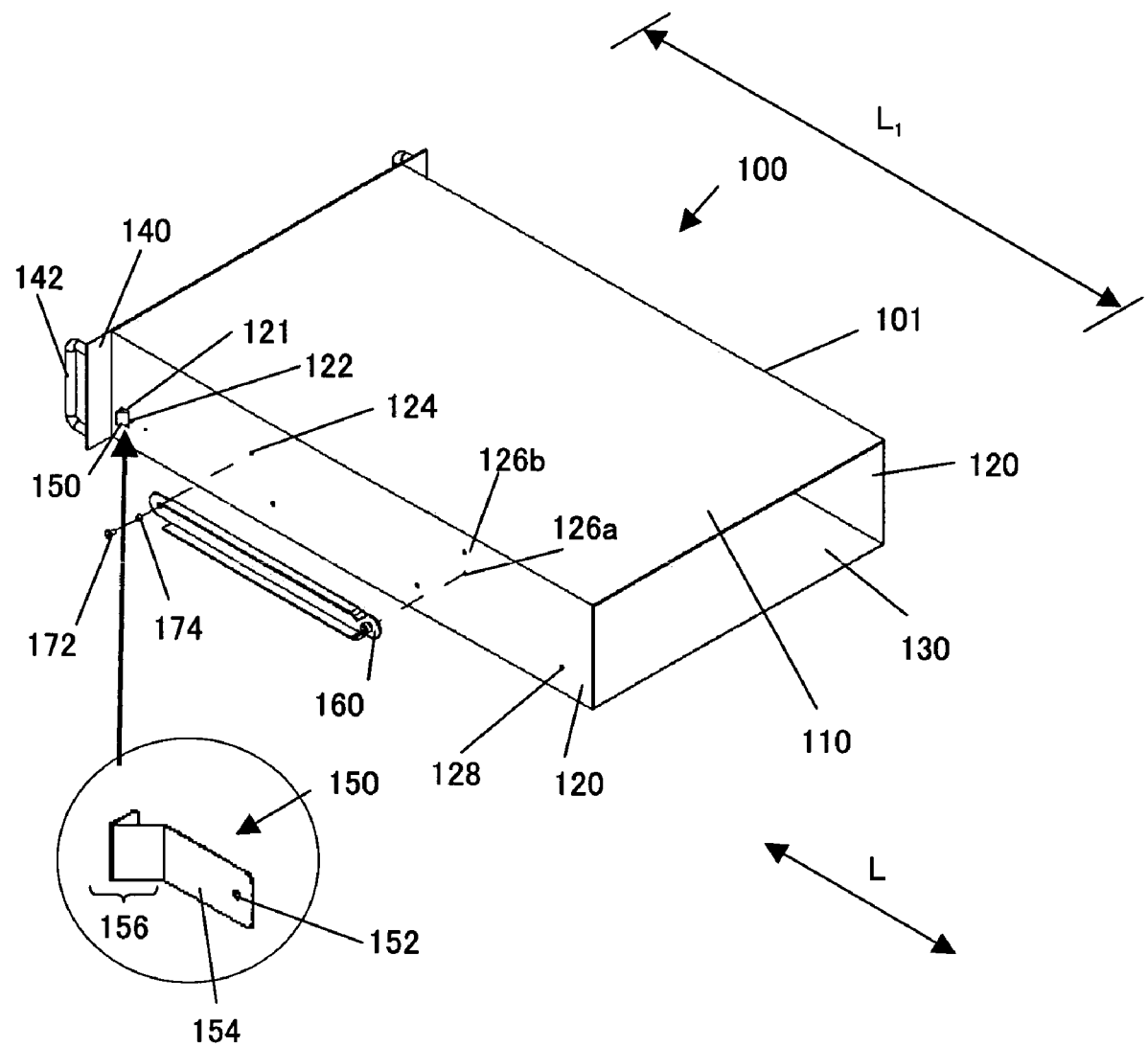
FIG. 3 is an exploded perspective view of the disc array storage according to one aspect of the present invention.
Figures 4A, 4B:
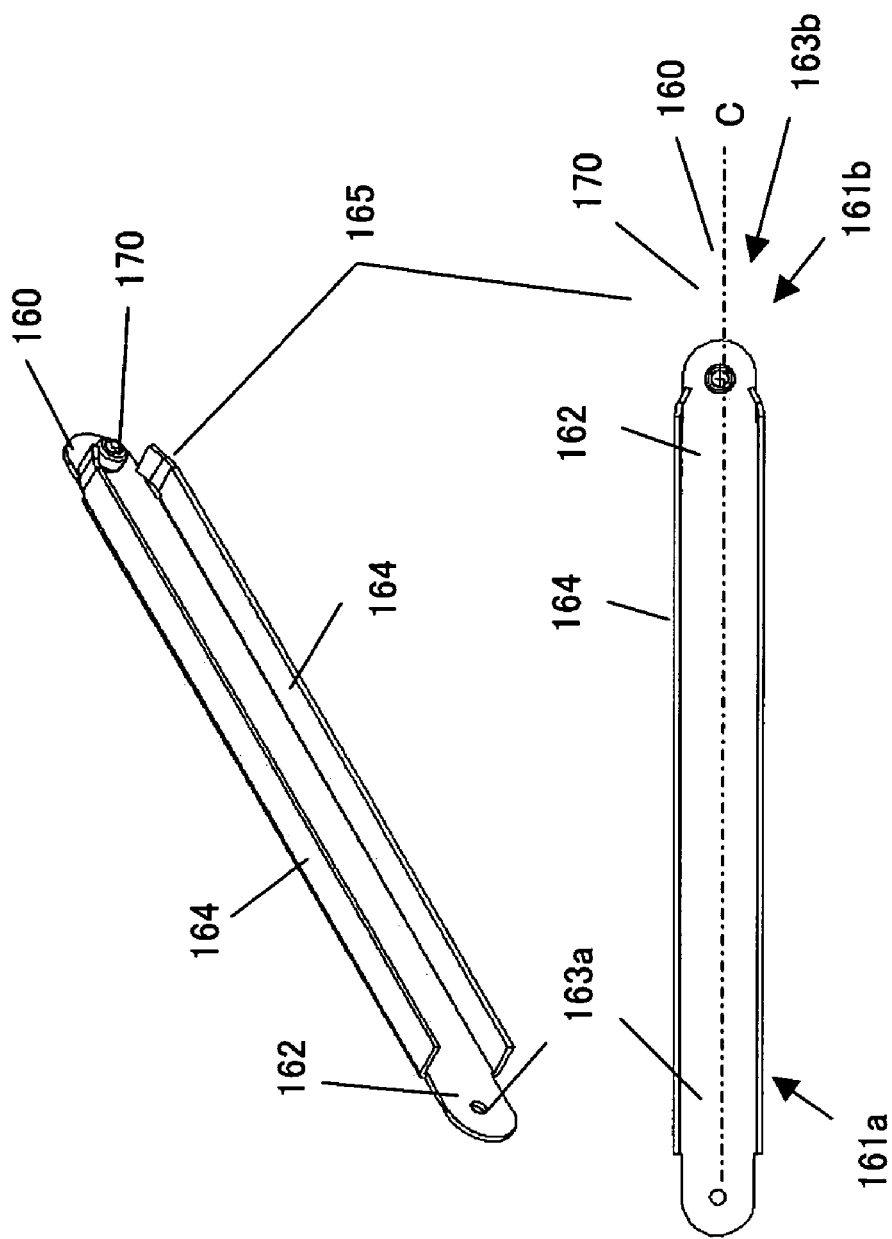
FIGS. 4A and 4B are schematic perspective and side views, respectively, of a guide frame in the disc array storage shown in FIG. 3.

The rack mount apparatus 200 includes a housing 210, four posts or rack pillars 220, a pair of brackets 230, and a pair of slide rails 240 in the housing 210. In finally (i.e., regularly, unconditionally or non-provisionally) fixing the disc array storage 10 onto commercially available slide rails 240, such as 5800 Series manufactured by Takachiho Koheki without provisional fixtures, unlike this embodiment which will be described later, it is necessary as shown by an arrow in FIG. 2A to support the disc array storage 10 relative to the slide rails 240 so that both side surfaces of the disc array storage 10 are positioned to the slide rails 240. Next, it is necessary as shown in FIG. 2B to support the disc array storage 10 heavier than 60 kg using a lifter of a few people from the bottom and to secure the slide rails 240 onto the disc array storage 10 using screws 190. Here, FIGS. 2A and 2B are perspective views for explaining a method for finally fixing the slide rails 240 onto the disc array storage 10 without provisional fixtures. However, if the disc array storage 10 is supported by human power, the disc array storage 10 shakes and it is difficult to align it with the screws 190. In addition, customers seldom have a lifter or similar equipment at installation sites and thus the installation is dangerous. This embodiment solves these problems as follows:

Referring now to FIGS. 3, 4A and 4B, a description will be given of the disc array storage 100 according to this embodiment. The disc array storage 100 is different from the disc array storage 10 in that the disc array storage 100 includes a flat spring 150 and a guide frame 160. More specifically, the disc array storage 100 includes a housing 101, a pair of flat springs 150, a pair of guide frames 160, and various fixing means (such as elements 170 and 172).

The housing 101 has a hollow rectangular parallelepiped shape with a top plate 110, a pair of side plates 120, a bottom plate 130, and a front panel 140.

The housing 101 except the front panel 140 is made by bending a sheet metal, and it may be formed like a U shape without the top plate 110. In omitting the top plate 110, the plate having the function of the top plate 10 (for protecting the internal electronic components) may be fixed onto the bracket 230 in the rack mount apparatus 200.

Each side plate 120 serves to support the flat spring 150 and the guide frame 160, and is connected to the slide rail 240. Each slide plate 120 has perforation holes 121 to 128. The perforation hole 121 is provided in each of the left and right side plates 120 near the front panel 140, and used for the flat spring 150 to partially project. The perforation hole 122 communicates with a perforation hole 152 in the flat spring 150, and serves as one in which a screw (not shown) is inserted to fix the flat spring 150. The perforation hole 124 is a screw hole with which a screw 172 is engaged. The perforation holes 126a and 126b are screw holes in which a thumbscrew 170 is inserted. A line that connects the perforation holes 124 and 126a to each other is parallel to the bottom surface 130, and accords with the extending direction of the slide rail 240. The perforation hole 126b is located on a circumference of a circle with a center of the perforation hole 124 and a radius of R, where R is a distance between the perforation holes 124 and 126a. In other words, viewed from the perforation hole 124, the perforation holes 126a and 126b are located on the same circumference of the circle. Four perforation holes 128 are arranged at regular intervals, and a line connecting them to one another is parallel to the bottom plate 130, and accords with the extending direction of the slide rail 240.

Figure 16A:
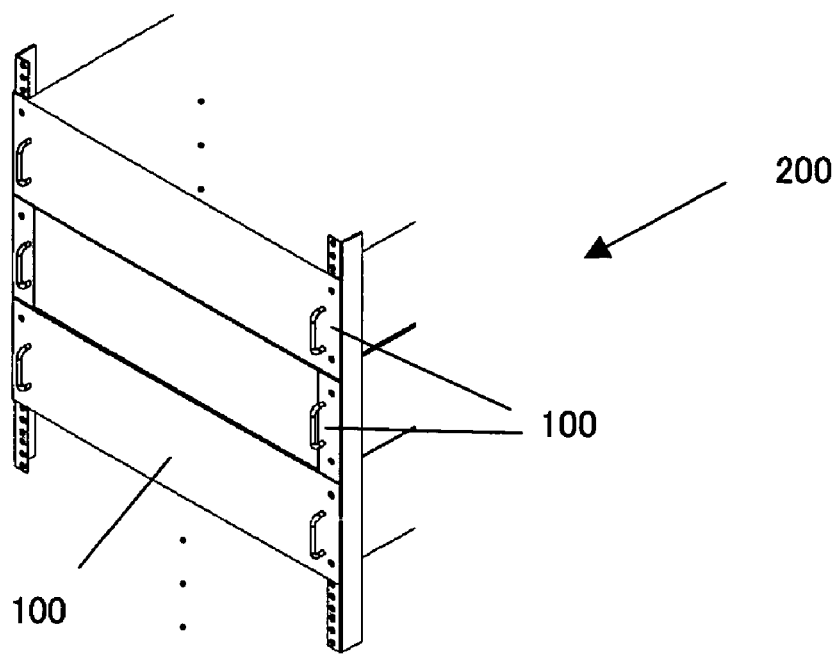
FIGS. 16A and 16B are schematic perspective views for explaining the operations of the rack mount apparatus shown in FIG. 1.

The bottom plate 130 supports electronic and other components, such as an HDD unit 50, which will be described later with reference to FIG. 16.

The front panel 140 is a plate member having a pair of grips 142, and provided to a front surface of the housing 101. The grips 142 are members, which a user holds and applies a force to move the disc array storage 100 relative to the rack mount apparatus 200. A connection between the front panel 140 and another portion of the housing may use bending, welding and other techniques known in the art. If necessary, the front panel 140 may be formed detachably in the housing 101.

The flat springs 150 are attached to the housing 101, and serve as provisional fixture parts engageable with the slide rails 240. The disc array storage 100 and slide rails 240 are firmly fixed via eight screws 190, as will be described later. This unconditional fixture is called "final fixture" in this specification. The "provisional fixture", on the other hand, is a rough engagement between the disc array storage 100 and the slide rails 240 prior to the final fixture. Since the provisional fixture parts or the flat springs 150 thus serve to partially hold and position the housing 101 relative to the housing 210, the positioning and support of the housing 101 are unnecessary in finally fixing the slide rails 240 onto the housing 101 and the workability improves.

Each flat spring 150 includes, as shown in FIG. 3, a perforation hole 152, a flat board part 154, and an engagement part 156. The perforation hole 152 communicates with the perforation hole 122, and serves as one in which a screw (not shown) is inserted. The screw (not shown) fixes the flat spring 150 onto the side plate 120. The flat board part 154 contacts the rear surface of the side plate 120. The engagement part 156 protrudes from the perforation hole 121 and engages with a rectangular hole 272 in the inner rail 270, which will be described later. The flat board part 154 bends and deforms when the engagement part 156 receives the force in a retreating direction.

The flat spring 150 is provided near the front surface of the housing 101, and can retreat from and protrude into the housing 101. The tip of the slide rail 240 can be provided near the front surface of the housing 101 by providing each slide rail 240 with an engagement part with the flat spring 150 at the tip of the slide rail 240, and positioning the flat spring 150 near the front surface of the housing 101. The slide rail 240 that extends over the overall length of the housing 101 in the longitudinal direction L maintains the stable connection between the slide rail 240 and the housing 101.

The guide frames 160 enables the housing 101 to move relative to the 210, and serve as a moving means for effectuating the provisional fixtures. Mere moving the housing 101 relative to the housing 210 using the moving means leads to the automatic provisional fixtures, and facilitates the workability.

The guide frames 160 are attached to the respective side plates 120 of the housing 101, and slidable on the slide rails 240. The guide frame 160 includes, as shown in FIGS. 4A and 4B, a horizontal part 162 parallel to the side plate 120, and a pair of perpendicular parts 164 perpendicular to the side plate 120, and has a U-shaped section symmetrical with respect to the centerline C.

The symmetrical guide frame 160 is commonly used for both side plates 120 of the housing 101, and provides better economic and productive efficiencies than a differently structured guide frame for each of the left and right side plates 120. The lower perpendicular part 164 of the guide frame 160 shown in FIG. 3 becomes an upper perpendicular part when attached to the backside side plate 120.

The horizontal part 162 has an elongated track shape, and has a proximal perforation hole 163a and a distal perforation hole 163b. The proximal perforation hole 163a is closer to the front surface of the housing 101 than the distal perforation hole 163b. The perforation hole 163a communicates with the perforation hole 124, and the perforation hole 163b communicates with the perforation hole 126a or 126b.

One of the pair of perpendicular parts 164 slides on the corresponding slide rail 240 for the provisional fixture during mounting. The pair of perpendicular parts 164 have a pair of proximal ends 161a close to the front surface of the housing 101, and a pair of distal ends 161b far from the front surface of the housing 101. The distal ends 161b are bent and form a pair of inclined parts 165 in such a direction that they approach to each other. The inclined part 165 can easily go on the slide rail 240 and reduces the interference between the guide frame 160 and the slide rail 240, improving the workability in detaching the disc array storage 100 from the rack mount apparatus 200, as described later.

The guide frame 160, especially its perpendicular part 164, has a length of about $L_1/2$, where $L_1$ is a length of the housing 101 in the direction L. In addition, the guide frame 160, especially its perpendicular part 164, preferably covers a range from $L_1/4$ to $3L_1/4$ from the front surface of the housing 101. If the guide frame 160 is too long, the thumbscrew 170 does not expose and it becomes difficult to displace the guide frame 160 and retreat it from the slide rail 240 as described later with reference to FIG. 9B. In addition, if the guide frame 160 is too short, mounting which will be described later with reference to FIG. 5 becomes difficult. Therefore, the above range is preferable.

The thumbscrew 170 is attached to the guide frame 160 while perforating through the perforation hole 163b in the horizontal part 162 of the guide frame 160. The thumbscrew 170 is attached to the perforation hole 126a or 126b in the side plate 120. The thumbscrew 170 does not require a tool, such as a screwdriver, and improves the assembly operation. The screw 172 is inserted into the perforation hole 124 after perforating through the perforation hole 163a via a spacer 174. Thereby, when an engagement between the thumbscrew 170 and the housing 101 is released, the guide frame 160 becomes rotatable around the perforation holes 163a and 124. The screw 172 is replaced with the thumbscrew 170.

Referring now to FIGS. 1, 2A and 2B, a description will be given of the rack mount apparatus 200. As described above, the rack mount apparatus 200 includes a housing 210, and four internal posts or rack pillars 220, a pair of brackets 230, and a pair of slide rails 240.

The housing 210 has a rectangular parallelepiped shape as shown in FIG. 1, and can house plural disc array storages 100 in its height direction. Provided inside the housing 210 are four posts 220, onto which a pair of brackets 230 are screwed along the direction L. The slide rail 240 is fixed onto the corresponding bracket 230, and the brackets 230 serve to support the slide rails 240 and the disc array storage 100 screwed onto the slide rails 240. Each bracket 230 has five perforation holes 232, and a line connecting these perforation holes 232 to each other is parallel to the longitudinal direction L of the disc array storage 100.

The slide rails 240 serve to enables the disc array storage 100 to move relative to the housing 210 along the L direction. The slide rails 240 of this embodiment uses such a commercially available product as 5800 Series manufactured by Takachiho Koheki, but the present invention does not limit the slide rails 240 to that product.

Each slide rail 240 includes an outer rail 250, an intermediate rail 260, and an inter rail 270. The outer rail 250, intermediate rail 260, and inter rail 270 have approximately the same length in the L direction as the length $L_1$ of the disc array storage 100 in the direction L. When the slide rails 240 are fixed onto both the side plates 120 of the housing 101, the user holds the grip 142 and draws the disc array storage 100 from the housing 210 or inserts the disc array storage 100 into the housing 210.

The outer rail 250 is made of a sheet metal having a U-shaped section, and extends along the longitudinal direction L of the bracket 230 over almost the overall length of the bracket 230. The outer rail 250 has a horizontal part 252, and a pair of perpendicular parts 256 perpendicular to the horizontal part 252. The horizontal part 252 is arranged parallel to the bracket 230, and the perpendicular parts 256 are formed by bending both ends of the horizontal part 252 at a right angle. The horizontal part 252 has five perforation holes 253 that are connected to five perforation holes 232, and is fixed onto the bracket 230 via these perforation holes 232 and 253.

Figure 6:
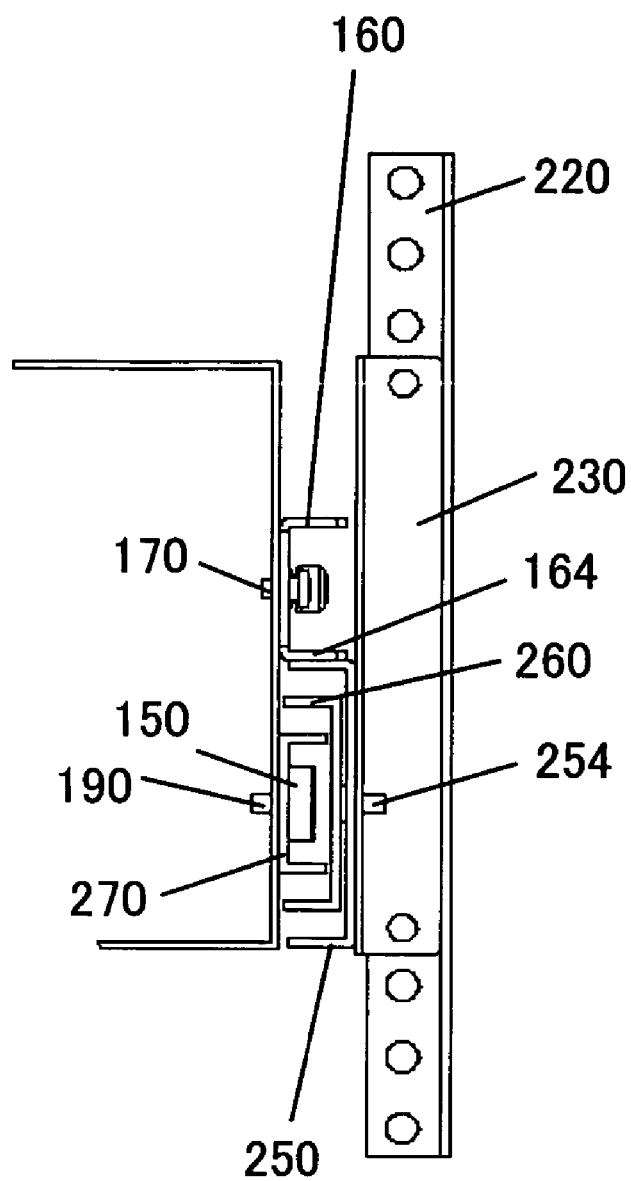
FIG. 6 is a partially enlarged sectional view of the disc array storage and the rack mount apparatus shown in FIG. 5.

Although the intermediate rail 260 is made of a sheet metal having a U-shaped section similar to the outer rail 250, the length of the intermediate rail 260 in the H direction is shorter than that of the outer rail 250 in the H direction. There are ball bearings between the outer rail 250 and the intermediate rail 260 in the H direction, and the intermediate rail 260 is arranged in the outer rail 250 so that the intermediate rail 260 can move in the L direction. As shown in FIG. 6, which will be described later, the U shapes of the intermediate rail 260 and the outer rail 250 face the same direction. The intermediate rail 260 has four perforation holes 262, but they are not used for the fixture of the intermediate rail 260. The intermediate rails 260 are not directly fixed onto the bracket 230, and the length of the intermediate rail 260 by which the intermediate rail 260 projects from the housing 210 is half the overall length or about $L_1/2$.

The inner rail 270 is made of a metal sheet having a U-shaped section similar to the outer rail 250, but the length of the inner rail 270 in the H direction is shorter than that of the intermediate rail 260 in the H direction. There are ball bearings between the inner rail 270 and the intermediate rail 260 in the H direction, and the inner rail 270 is arranged in the intermediate rail 260 movably in the L direction. As shown in FIG. 6, which will be described later, the U shapes of the intermediate rail 260 and the inter rail 270 face each other. The inner rail 270 is not fixed onto the bracket 230 or intermediate rail 260, and the length of the inner rail 270 by which the inner rail 270 projects from the housing 210 is the overall length or about $L_1$.

Each inner rail 270 has one rectangular hole 272, and four perforation holes 274. The rectangular hole 272 is a portion engageable with the engagement part 156 of the flat spring 150. The four perforation holes 274 communicate with four perforation holes 128 in the side plate 120 of the housing 101. The inner rails 270 are fixed onto the side plates 120 of the housing 101 via the perforation holes 128 and 274 and the screws 190.

Figure 5:
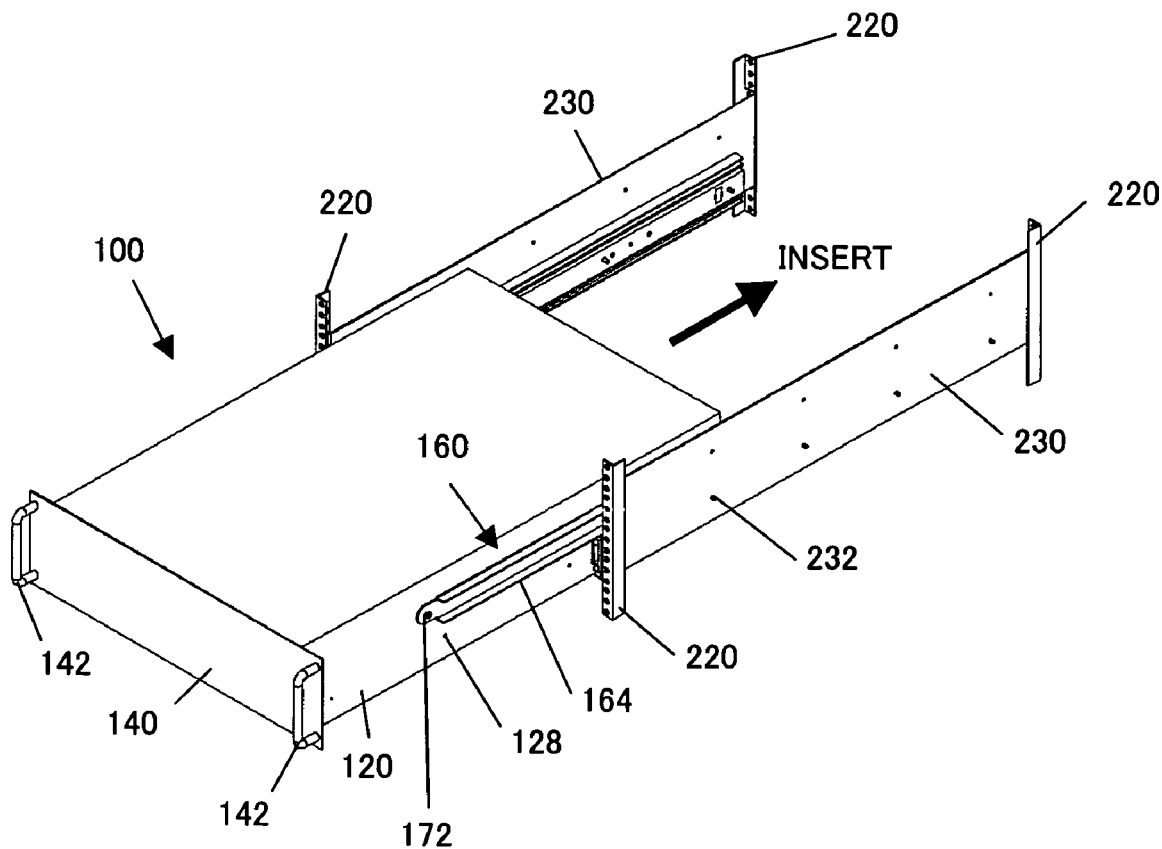
FIG. 5 is a perspective overview for explaining a method of mounting the disc array storage shown in FIG. 3 in the rack mount apparatus.
Figure 7:
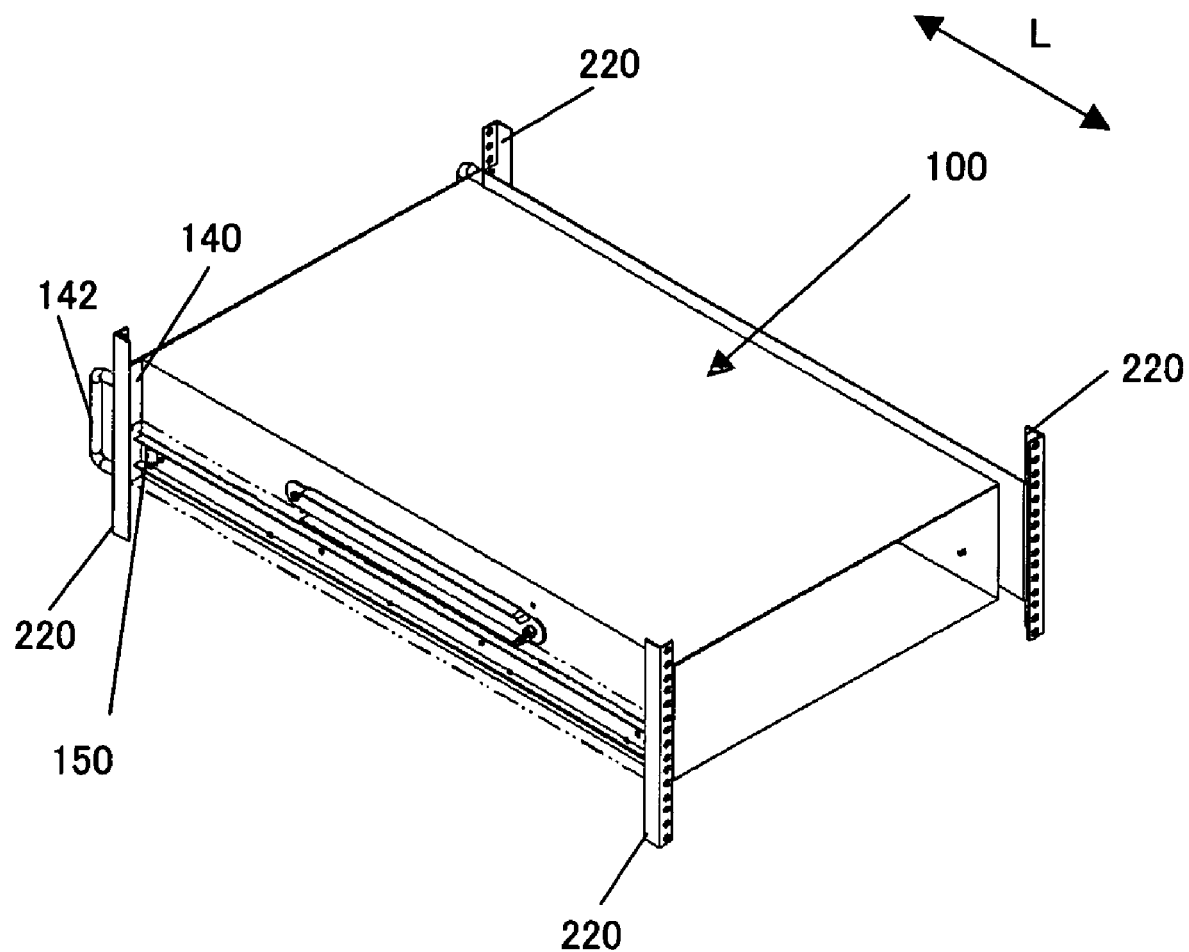
FIG. 7 is a partially transparent perspective view showing that the disc array storage shown in FIG. 5 is completely housed in the rack mount apparatus.
Figure 8:
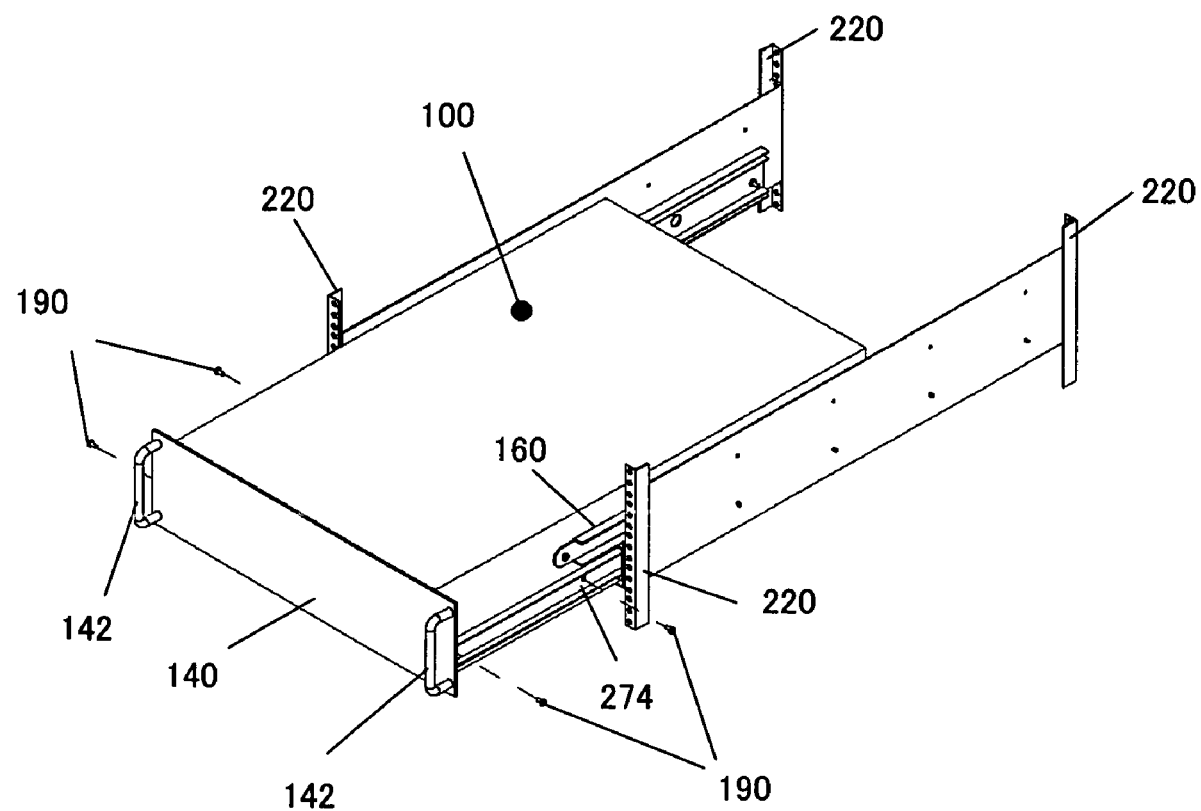
FIG. 8 is a perspective overview showing that the disc array storage is partially drawn from the state shown in FIG. 7.
Figure 9A:
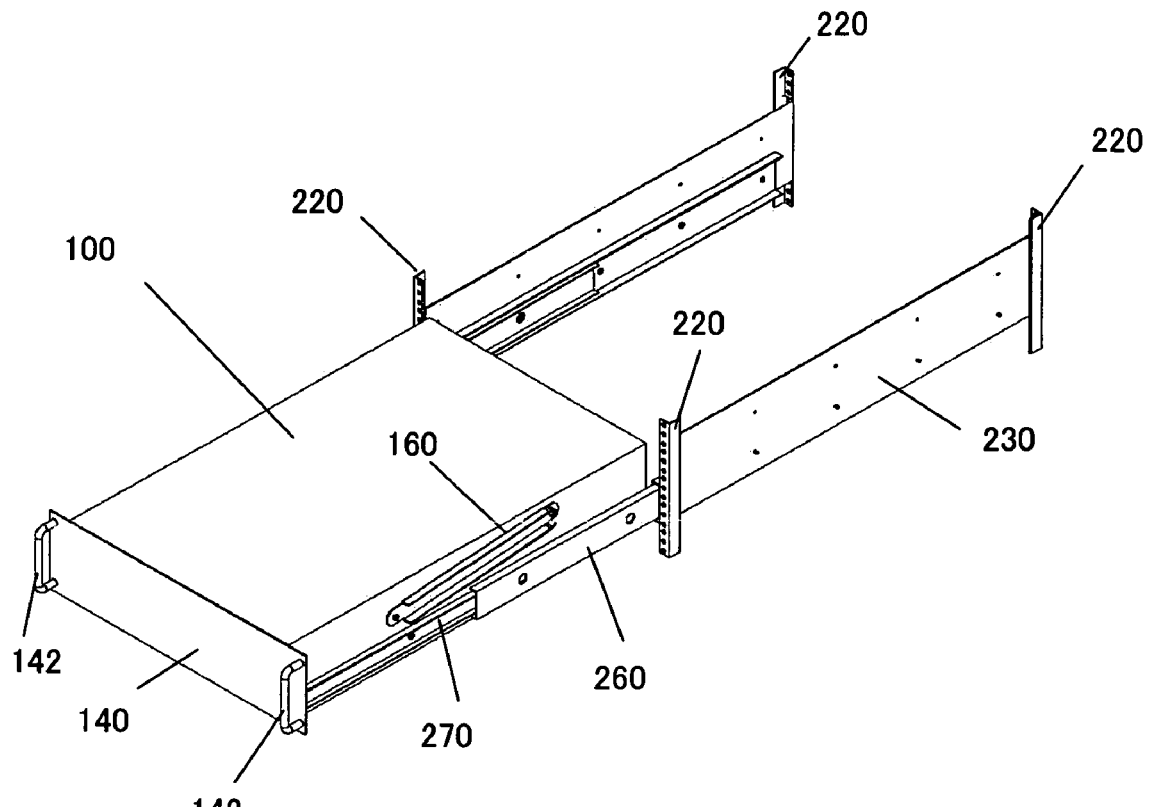
FIG. 9A is a schematic perspective view showing that the guide frame is displaced after the disc array storage is finally fixed.
Figure 9B:
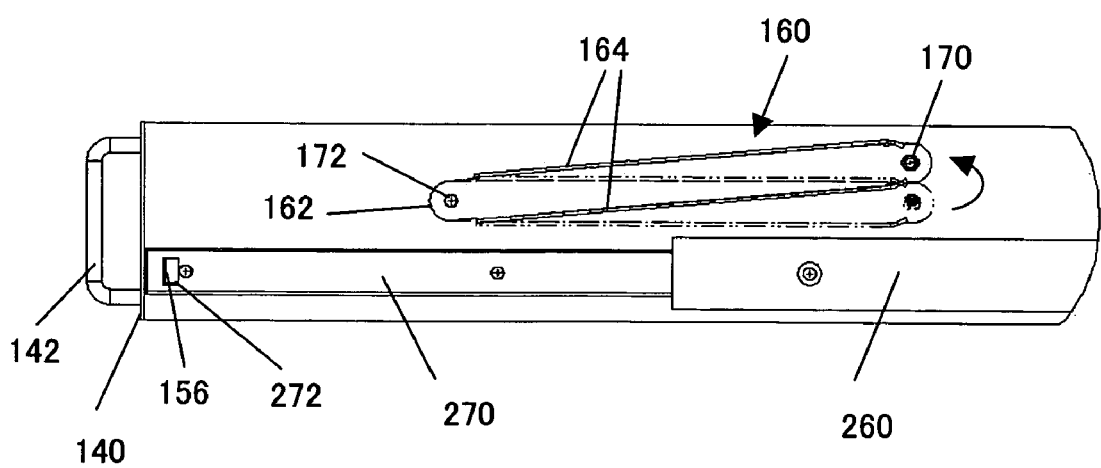
FIG. 9B is an enlarged side view of that state.
Figure 10:
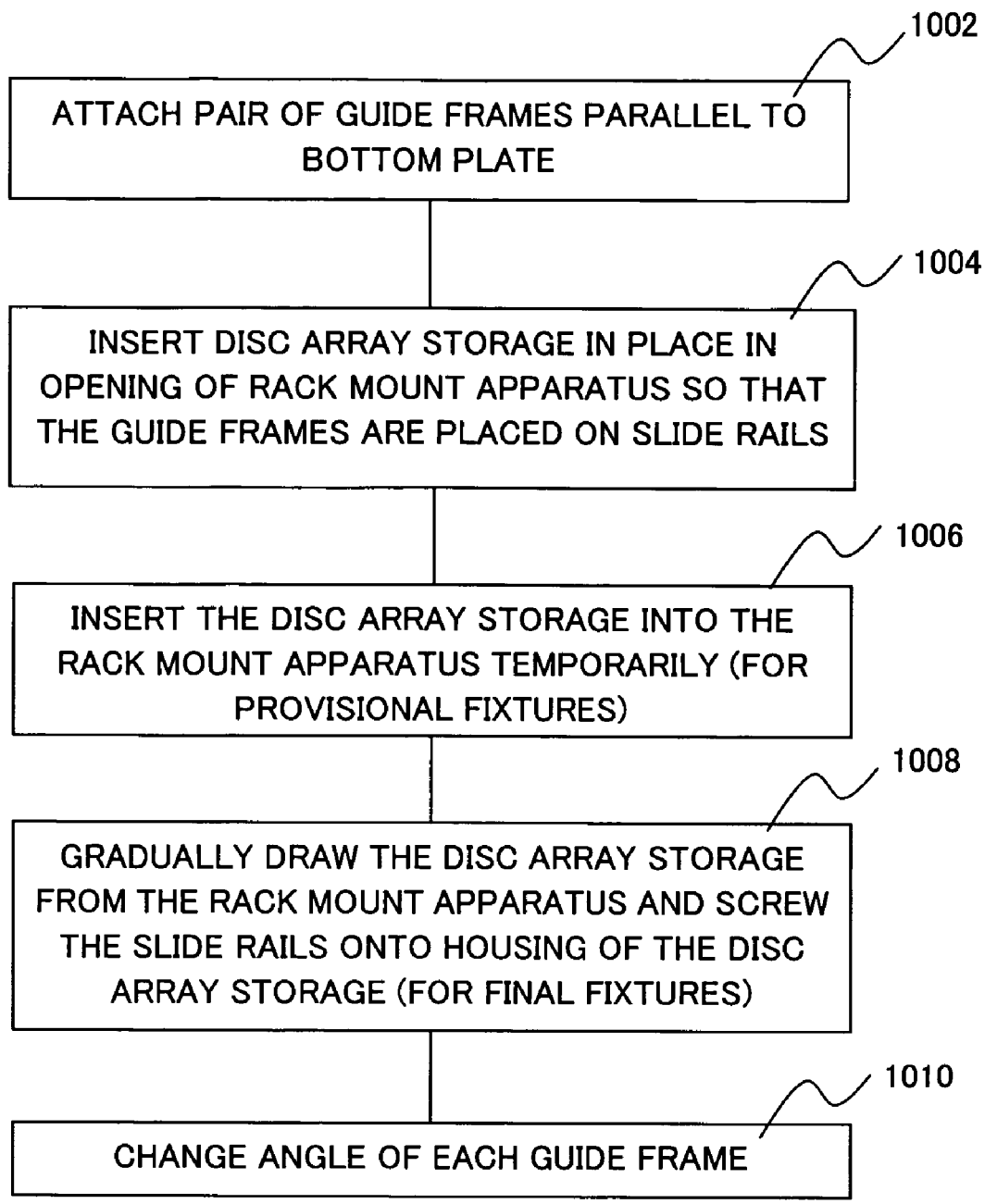
FIG. 10 is a flowchart for explaining a method of mounting the disc array storage in the rack mount apparatus according to one aspect of the present invention.

Referring now to FIGS. 5 to 10, a description will be given of a method for mounting the disc array storage 100 into the rack mount apparatus 200. Here, FIG. 5 is a schematic perspective view for explaining the provisional fixture of the disc array storage 100. FIG. 6 is a sectional view with respect to a plane parallel to the front surface of the disc array storage 100 in the state shown in FIG. 5. FIG. 7 is a partially transparent perspective view of the disc array storage 100 that has been provisionally fixed. FIG. 8 is a schematic perspective view showing that the disc array storage 100 is gradually drawn from the rack mount apparatus 200 so as to finally fix the slide rails 240 onto the housing 101 of the disc array storage 100 that has been provisionally fixed. FIG. 9A is a schematic perspective view showing a change of the angle of the guide frame after the final fixtures are completed. FIG. 9B is an enlarged side view of that state shown in FIG. 9A. FIG. 10 is a flowchart for explaining a method of mounting the disc array storage 100 into the rack mount apparatus 200.

Initially, the guide frame 160 is attached parallel to the bottom plate 130 (step 1002). At this time, the user attaches the thumbscrew 170 to the perforation hole 126a. This arrangement enables the lower perpendicular parts 164 of the guide frames 160 to serve as the moving means in mounting the housing 101 into the housing 210 for provisional fixtures.

Next, the user inserts the disc array storage 100 into the opening in the rack mount apparatus 200 so that the guide frames 160 are placed on the slide rails 240 (step 1004). This action is easy because all what is necessary is merely to place the guide frames 160 on the slide rails 240 and squeeze the housing 101 into the housing 210. More specifically, the disc array storage 100 is inserted into the rack mount apparatus 200 so that the lower perpendicular parts 164 of the guide frames 160 are placed on the upper perpendicular parts 256 of the outer rails 250. FIGS. 5 and 6 show this state.

Then, as shown in an arrow in FIG. 5, the disc array storage 100 is inserted, and the disc array storage is temporarily stored in the rack mount apparatus 200 (step 1006). FIG. 7 shows this state. In step 1006 shown in FIG. 7, the engagement parts 156 of the flat springs 150 are engaged with the rectangular holes 272 in the inner rails 270. More specifically, as the disc array storage 100 proceeds in the rack mount apparatus 200 after the engagement parts 156 contact the inner rails 270, the engagement parts 156 deform and retreat in the housing 101, then face and thus protrude into the rectangular holes of the inner rails 270.

This state is the provisional fixtures state, and the housing 101 is engaged with the slide rails 240 via the flat springs 150 and the inner rails 270. In addition, the perforation holes 274 in the inner rails 270 communicate with the perforation holes 128 in the side plates 120 due to the provisional fixtures. In this state, the housing 101 and the slide rails 240 are not firmly coupled, and thus when the housing 101 is drawn as shown in FIG. 2B, the weight of the housing 101 concentrates on the flat springs 150 and the disc array storage 100 would drop. In order to avoid this problem, it is necessary as shown in FIG. 2B to firmly couple the slide rails 240 with the housing 101 using the screws 190.

Accordingly, the slide rails 240 are next screwed onto the housing 101 while the disc array storage 100 is gradually being drawn from the rack mount apparatus 200 (step 1008). While the user is gradually drawing the disc array storage 100 from the rack mount apparatus 200 through the grips 142, the flat springs 150 are engaged with the inner rails 270 and thus the inner rails 270 are gradually being drawn. Therefore, whenever the perforation holes 274 and 128 expose, the screws 190 are attached to these holes. FIG. 8 shows this state.

The provisional fixtures parts (or the flat springs 150 and the rectangular holes 272) position and hold the housing 101 relative to the housing 210 during the final fixtures between the housing 101 and the slide rails 240, and improves the workability, because it is unnecessary unlike the conventional structure to use lifter etc. to position and hold the housing 101. In addition, the final fixtures made while the housing 101 is being drawn from the housing 210 prevent overloads upon the provisional fixtures parts and a possible drop of the housing 101 from the housing 210.

When the slide rails 240 completely project, the inner rails 270 are firmly coupled with the housing 101 via the screws 190 and the slide rails 240 support the disc array storage 100 stably.

After the slide rails 240 completely project and the final fixtures end, the angles of the guide rails 160 are changed (step 1010). FIGS. 9A and 9B show this state. As shown in an arrow shown in FIG. 9B, the user displaces the thumbscrews 170 from the perforation holes 126a to the perforation holes 126b. This is because the thumbscrews 170 if remaining at the perforation holes 126a would cause the lower perpendicular parts 164 of the guide rails 160 to collide with the upper perpendicular parts 256 of the outer rails 250 of the slide rails 240 in again inserting the disc array storage 100 into the rack mount apparatus 200. The displaced guide frames 160 are spaced from the slide rails 240, and prevent the interferences between the guide frames 160 and the slide rails 240 in moving the housing 101 after the final fixtures.

Figure 16B:
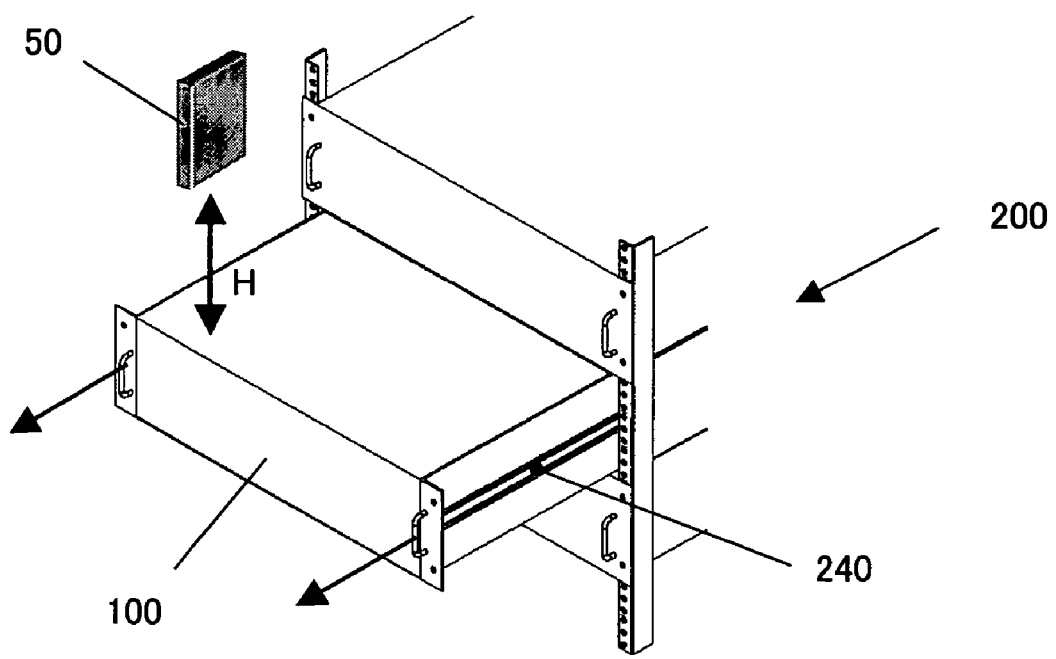

In operation, the disc array storage 100 that has been stored in the rack mount apparatus 200 (FIG. 16A) is drawn from the rack mount apparatus 200, and the HDD unit 50 is inserted into its height direction H (FIG. 16B). The HDD unit 50 is, for example, a 2.5-inch HDD unit, as disclosed in Japanese Patent Applications, Publication Nos. 2004-241231 and 2005-182996.

This embodiment removes the top plate 110 of the housing 101, and the HDD unit 50 can be installed in the disc array storage 100 through the entire top surface. Therefore, plural rows of HDD units 50 in the longitudinal direction L can be installed in the disc array storage 100, and providing the higher installation density than the conventional structure in which the HDD units are inserted and ejected only through the front panel 140. As a result, the rack mount apparatus 200 can increase both the capacity per disc array storage 100 and its entire capacity, satisfying the recent high storage capacity demand.

Figure 11:
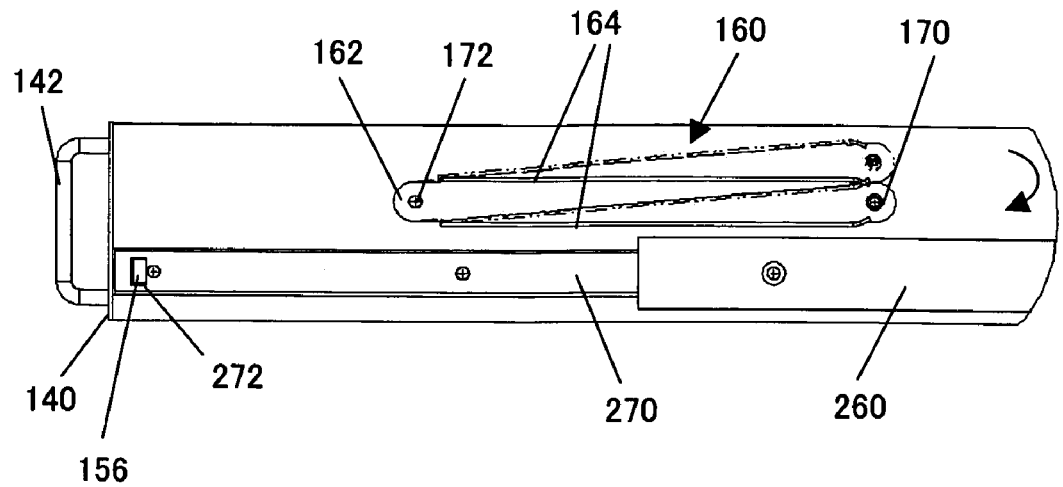
FIG. 11 is an enlarged side view showing that the guide frame is displaced in order to detach the disc array storage from the rack mount apparatus.
Figure 12:
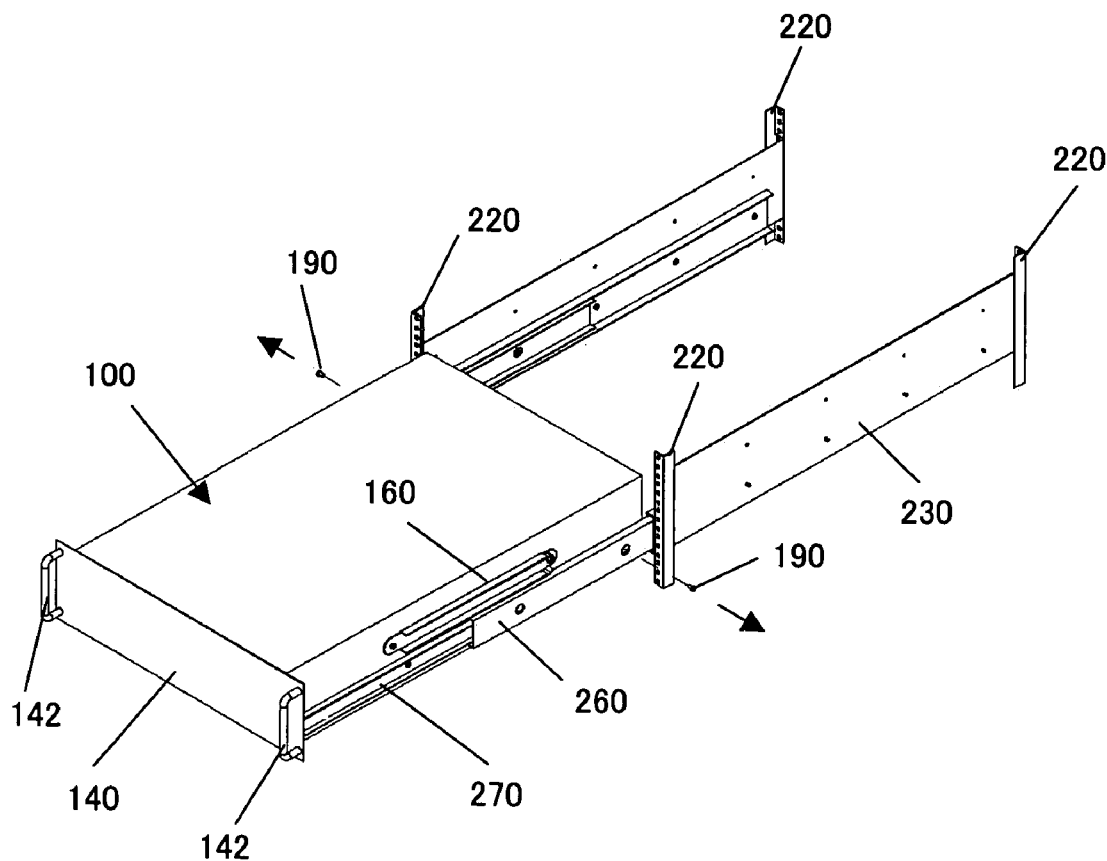
FIG. 12 is a perspective overview showing that the disc array storage is gradually inserted into the rack mount apparatus from the state shown in FIG. 11 and the final fixture is released.
Figure 13:
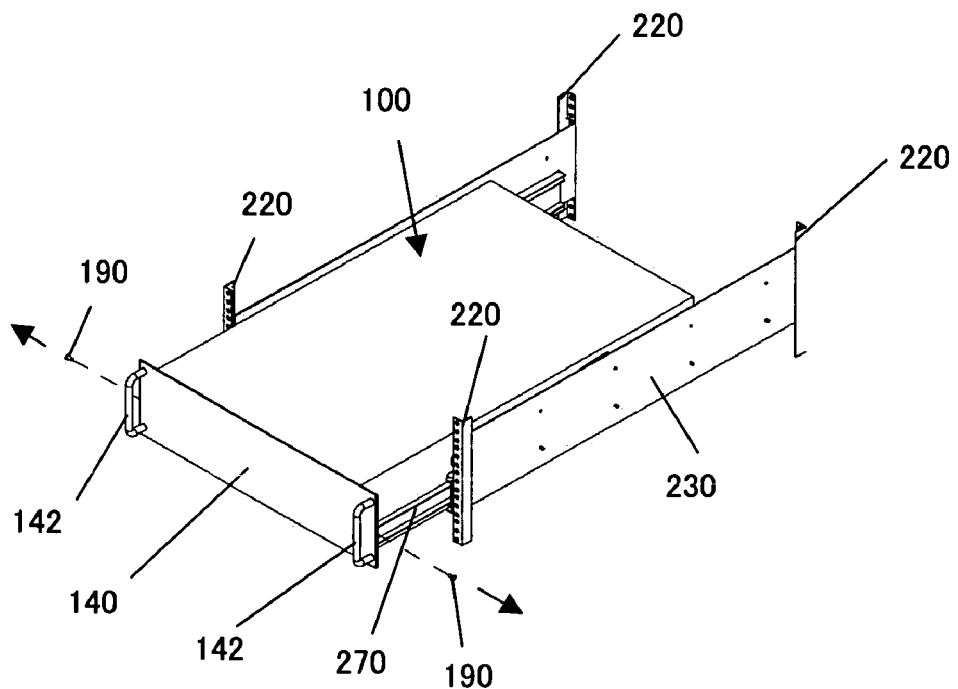
FIG. 13 is a perspective overview showing that the last screws for final fixtures are detached after the state shown in FIG. 12.
Figure 14:
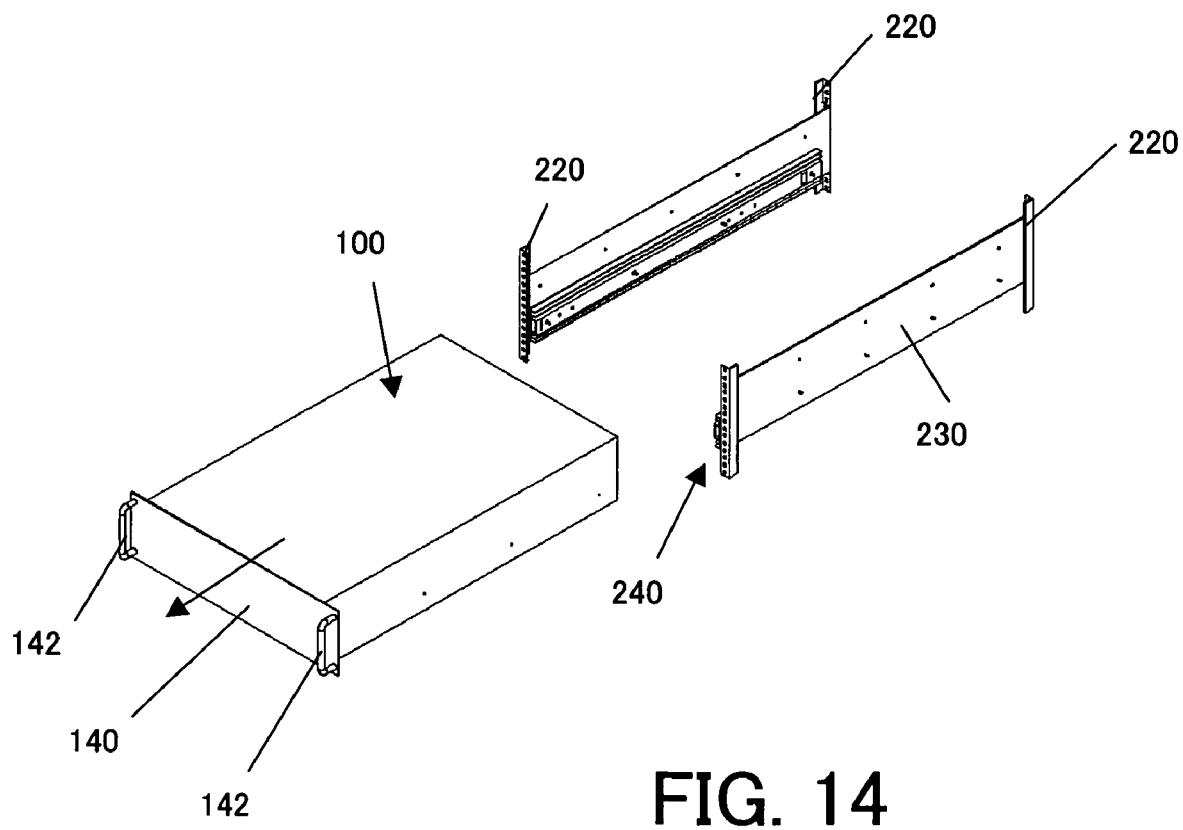
FIG. 14 is a perspective overview showing that the disc array storage is being detached from the rack mount apparatus.
Figure 15:
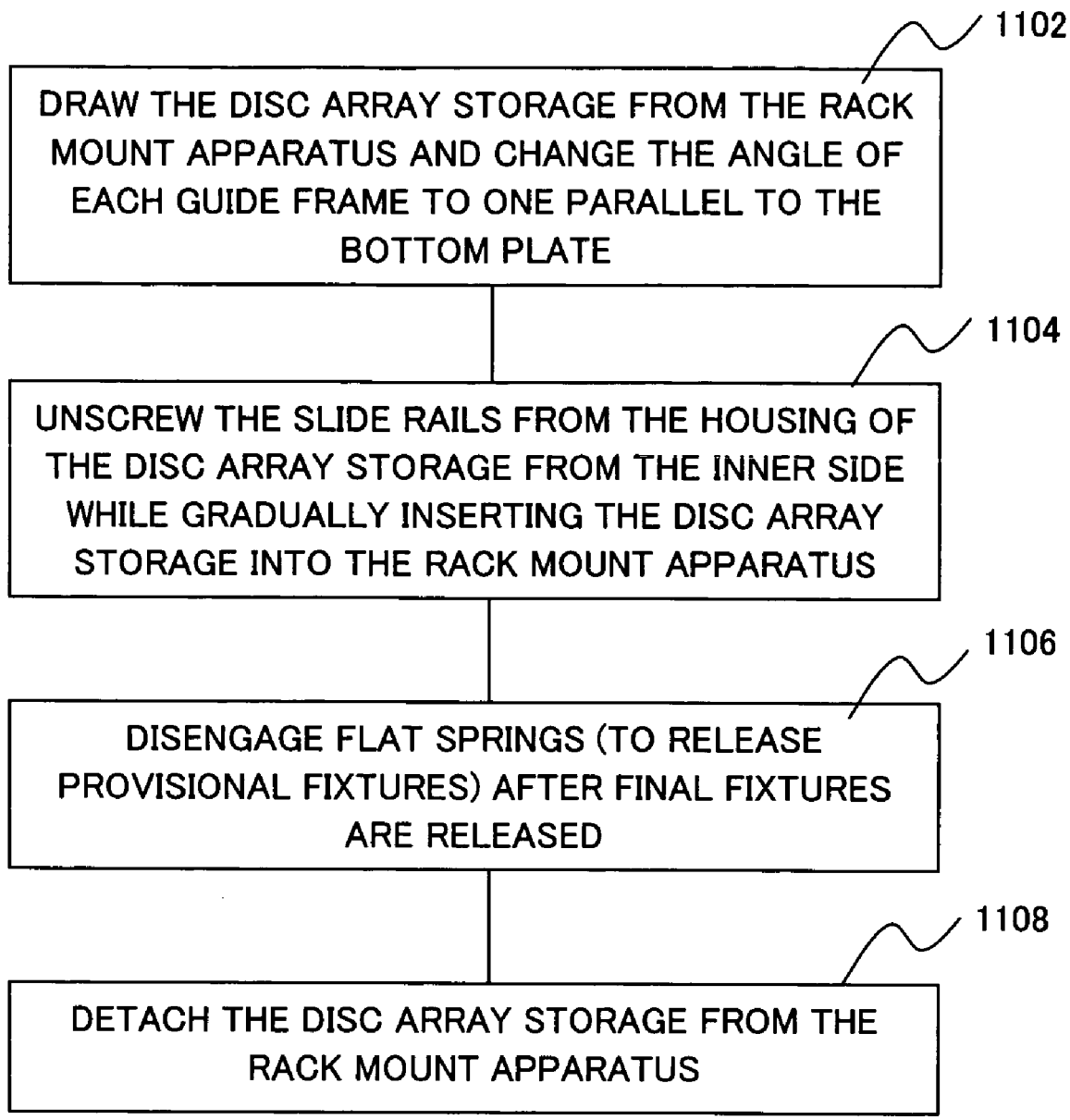
FIG. 15 is a flowchart for explaining a method of detaching the disc array storage from the rack mount apparatus according to another aspect of the present invention.

Referring now to FIGS. 11 to 15, a description will be given of a method for detaching the disc array storage 100 from the rack mount apparatus 200. Here, FIG. 11 is a partially enlarged side view showing a change of the angle of the guide frame 160. FIG. 12 is a schematic perspective view showing a release of the final fixtures of the disc array storage 100. FIG. 13 is a schematic perspective view of the disc array storage that has been provisionally fixed. FIG. 14 is a schematic perspective view showing that the disc arrays storage 100 is detached from the rack mount apparatus 200 after the provisional fixtures are released. FIG. 15 is a flowchart for explaining a method of detaching the disc array storage 100 from the rack mount apparatus 200.

Initially, the disc arrays storage 100 is drawn from the rack mount apparatus 200 and the angles of the guide frames 160 are changed to be parallel to the bottom plate 130 (step 1102). FIG. 11 shows this state. At this time, as shown by an arrow shown in FIG. 11, the user displaces the thumbscrews 170 from the perforation holes 126b to the perforation holes 126a. Then, the lower perpendicular parts 164 of the guide frames 160 are approximately level with the upper perpendicular parts 256 of the outer rails 250, and the guide frames 160 do not contact the intermediate rails 260 or inner rails 270.

Next, the slide rails 240 are unscrewed from the housing 101 from the inner side while the disc array storage 100 is gradually inserted into the rack mount apparatus 200 (step 1104). FIG. 12 shows this state.

As the user inserts the disc array storage 100 into the rack mount apparatus 200 via the grips 142, the lower inclined parts 165 contact the upper perpendicular parts 256 of the outer rails 250. As the disc array storage 100 is further inserted into the rack mount apparatus 200, the inclined parts 165 go on the outer rails 250. Since the perpendicular parts 164 have the inclined parts 165 at the ends 161b, they easily go on the outer rails 250. The inclined parts may be provided to the outer rails 250 instead of the perpendicular parts 164. As a result, the guide rails 160 are placed on the slide rails 240.

After the screws 190 that are closest to the front surface are detached by repeating the above operation, the provisional fixtures between the housing 101 and the rack mount apparatus 200 or between the housing 101 and the slide rails 240 are released by squeezing the engagement parts 156 of the flat springs 150 (step 1106). Then, the user draws the disc array storage 100 from the rack mount apparatus 200 (step 1108). The inner rails 270 that project from the housing 210 are squeezed into the housing 210 in step 1106 or 1108.

Further, the present invention is not limited to these preferred embodiments, and various variations and modifications may be made without departing from the scope of the present invention. For example, the above embodiment discusses the unit as the 2.5-inch HDD unit and a 3.5-inch HDD unit and other sized units are applicable.

Thus, the present invention can provide an electronic apparatus, a rack mount apparatus and a mounting method, in which the electronic apparatus can be easily mounted on the rack mount apparatus.

What is claimed is:

1. An electronic apparatus that can be ejectably mounted in a rack mount apparatus that includes a first housing and a mechanism adapted to project from the first housing, said electronic apparatus comprising:
a second housing that is fixed onto the mechanism, and mounted in the first housing so that said second housing can be drawn from the first housing; and
a provisional fixture member that is attached to said second housing and engageable with the mechanism, the provisional fixture member holding said second housing relative to said first housing.

2. An electronic apparatus according to claim 1, wherein said provisional fixture member includes a flat spring provided near a front surface of said second housing, the flat spring being able to retreat into said second housing and project from said second housing.

3. An electronic apparatus according to claim 1, further comprising a moving unit that enables said second housing to move relative to the first housing.

4. An electronic apparatus according to claim 3, wherein said moving unit includes a guide frame attached to said second housing and slidable on the mechanism.

5. An electronic apparatus according to claim 4, wherein the guide frames are attached to a pair of side surfaces that is orthogonal to a front surface of said second housing, and has such a U-shaped section that the guide frame includes a horizontal part parallel to the side surface of said second housing, and a pair of perpendicular parts perpendicular to the side surface.

6. An electronic apparatus according to claim 5, wherein the pair of perpendicular parts have a pair of proximal ends, and a pair of distal ends, the pair of proximal ends being closer to the front surface of said second housing than the pair of distal ends, the pair of distal ends being bent in such a direction that the distal ends approach to each other.

7. An electronic apparatus according to claim 4, wherein the guide frame has a length of at least L/2 and covers a range from L/4 to 3L/4 from the front surface of said second housing, where L is a length of said second housing in a drawing direction.

8. An electronic apparatus according to claim 3, wherein said moving unit is adapted to displace between first and second positions,
wherein when said moving unit is located at the first position, said second housing moves relative to the first housing while said moving unit contacts the rack mount apparatus, and
wherein when said moving unit is located at the second position, said second housing moves relative to the first housing while said moving unit is being spaced from the rack mount apparatus.

9. An electronic apparatus according to claim 3, wherein said moving unit has first and second ends, and
wherein said moving unit is attached to said second housing rotatably at the first end, and said moving unit is engageable with two different positions of said second housing at the second end, said moving unit including a thumbscrew at the second end.

10. An electronic apparatus according to claim 1, wherein plural units are attached to and ejected from said electronic apparatus along a height direction of said electronic apparatus.

11. A rack mounted apparatus that is mounted with an electronic apparatus so that the electronic apparatus can be drawn from said rack mounted apparatus, said rack mounted apparatus comprising a first housing and a mechanism that is adapted to project from the first housing,
wherein said electronic apparatus includes a second housing that is fixed onto the mechanism, and a provisional fixture member that is attached to said second housing and engageable with the mechanism, the provisional fixture member holding said second housing relative to said first housing.

12. A rack mount apparatus according to claim 11, wherein the electronic apparatus further includes a guide frame attached to the second housing and slidable on the mechanism, said guide frame enabling the second housing to move relative to the first housing, the mechanism having a first end, the guide frame having a second end, at least one of the first and second ends being inclined, wherein in inserting the second housing that has been drawn from the first housing, into said first housing, the second end of the guide frame contacts the first end of the mechanism.

13. A method for mounting an electronic apparatus in a rack mount apparatus having a first housing and a mechanism adapted to project from the first housing, an electronic apparatus including a second housing, said method comprising the steps of:

provisionally fixing the second housing onto the mechanism; and finally fixing the second housing onto the mechanism while the second housing being moved relative to the first housing, a provisional fixture member holding said second housing relative to said first housing.

14. A method according to claim 13, wherein said provisional fixing step includes the step of inserting the second housing into the first housing so as to effectuate provisional fixing, and wherein said finally fixing step includes the step of drawing from the first housing the second housing with the mechanism that has been provisionally fixed onto the second housing.

15. A method according to claim 14, wherein said inserting step includes the step of setting to a first state a moving unit that enables the second housing to move relative to the first housing, wherein said method further comprises the step of setting the moving unit to a second state different from the first state after said finally fixing step, wherein when said moving unit is located at the first position, said second housing moves relative to the first housing while said moving unit contacts the rack mount apparatus, and wherein when said moving unit is located at the second position, said second housing moves relative to the first housing while said moving unit is being spaced from the rack mount apparatus.

* * * * *